United States Patent [19]
Bernstein

[11] Patent Number: 5,861,325
[45] Date of Patent: Jan. 19, 1999

[54] TECHNIQUE FOR PRODUCING INTERCONNECTING CONDUCTIVE LINKS

[75] Inventor: Joseph B. Bernstein, Somerville, Mass.

[73] Assignee: Massachusetts Institute of Technology, Cambridge, Mass.

[21] Appl. No.: 209,997

[22] Filed: Mar. 10, 1994

[51] Int. Cl.⁶ .................................................. H01L 21/82
[52] U.S. Cl. .......................................... 438/131; 438/601
[58] Field of Search .................................. 437/173, 174, 437/195, 904

[56] References Cited

U.S. PATENT DOCUMENTS

| | | | |
|---|---|---|---|
| 4,240,094 | 12/1980 | Mader | 357/45 |
| 4,636,404 | 1/1987 | Raffel et al. | |
| 4,665,295 | 5/1987 | McDavid | 219/121 |
| 4,700,214 | 10/1987 | Johnson | 357/68 |
| 4,701,860 | 10/1987 | Mader | 364/490 |
| 4,720,470 | 1/1988 | Johnson | 437/173 |
| 4,751,197 | 6/1988 | Wills | 437/174 |
| 4,810,663 | 3/1989 | Raffel et al. | |
| 4,893,167 | 1/1990 | Boudou et al. | |
| 4,912,066 | 3/1990 | Wills | 437/922 |
| 4,916,809 | 4/1990 | Boudou et al. | |
| 4,937,475 | 6/1990 | Rhodes et al. | |
| 5,087,589 | 2/1992 | Chapman et al. | 437/195 |
| 5,110,754 | 5/1992 | Lowrey et al. | 437/52 |
| 5,166,547 | 11/1992 | Babakanian et al. | |
| 5,166,556 | 11/1992 | Hsu et al. | |
| 5,231,050 | 7/1993 | Boudou et al. | 437/173 |
| 5,250,464 | 10/1993 | Wong et al. | 437/170 |
| 5,284,788 | 2/1994 | Spratt et al. | 437/170 |

FOREIGN PATENT DOCUMENTS 0 256 494   2/1988   European Pat. Off.

OTHER PUBLICATIONS

Cohen, S.S. et al, "The Mechanism of Laser–Induced Vertical Links," *Journal of Electrochemical Society*, vol. 138, No. 10, Oct. 1991, pp. 3013–3018.

Yield and Reliability of Laser Formed Verticak Links, H.D. Hartmann, 146/SPIE vol. 2090 Multilevel Interconnection (1993).

Laser Programmable Interconnects for the Quick Turn Around of Electronic Systems, Rex A. Lee et al., 4.6/Lee/Laser–Programmable Interconnects.

Laserpersonalization of Interconnection Arrays for Hybride Asic's M. Burnus et al., 0–7803–0867–0/93, 1993 IEEE.

Laser Programmable Vias for Reconfiguration of Integrated Circuits, Matrine Rouillon–Martin et all., 190/SPIE vol. 1138 Optical Microlithography and Metrology fro Microcircuit Fabrication (1989).

Area–Selective Laser Processing Techniques for Multichip Interconnect, Y.S. Liu et al., Mat. Res. Soc. Symp. Proc. vol. 154 1989 Materials Research Society.

On The Design of High–Yield Reconfigurable PLA's, Dong Sam Ha and Vijay P. Kumar, 0018–9340–90–0400–0470, 1990 IEEE.

High Density Metal Cross–Point Laset Linking, Joseph B. Bernstein et al., 0–8186–2482–5/92, 1992 IEEE.

High Performance Contact Formation in LSI Circuit Restructuring Using Visible Pulse Laset Induced Ablation and CVD, Y. Morishige et al., 0169–4332/90, 1990—Elsevier Science Publishers B.V. (North–Holland).

*Primary Examiner*—Kevin M. Picardat
*Attorney, Agent, or Firm*—Hamilton, Brook, Smith & Reynolds, P.C.

[57] ABSTRACT

A method for providing a conductive link between conductive materials, e.g., metals, separated by a non-conductive material, e.g., a silicon based glass material. In a preferred embodiment a single pulse of laser energy is applied to at least one of the conductive materials to produce mechanical strain therein which strain initiates a fracturing of the non-conductive material so as to provide at least one fissure therein extending between the conductive materials. The laser energy pulse further causes at least one of the conductive materials to flow in such fissure to provide a conductive link between the conductive materials.

12 Claims, 2 Drawing Sheets

TECHNIQUE FOR PRODUCING INTERCONNECTING CONDUCTIVE LINKS

This invention was made with government support under contract number F19628-90-C-0002 awarded by the Air Force. The government has certain rights in the invention.

INTRODUCTION

This invention relates generally to techniques for producing interconnecting conductive links and, more particularly, to a unique process for providing conductive links between two conductive materials having a non-conductive material positioned between them.

BACKGROUND OF THE INVENTION

Configurations of interconnected arrays of conductive elements, as used, for example, in programmable logic gate arrays, requires the formation of conductive links, or paths, between selected conductive elements in a manner which produces relatively low resistance links between them. Techniques for producing such low resistance conductive links have been developed using either electrical or laser linking and cutting processes.

The latter laser processes have been preferred for certain applications because they provide permanent links and require no programming wiring or high voltage switching on the chip. Laser programmable techniques have the potential for providing higher performance and greater link density than electrical techniques if the linking device itself is sufficiently small. Ultimately the minimum size laser link would be a simple crossing of two wires. However, up to now insofar as is known, a successful process does not exist for providing such links. A primary concern when using any linking technology is the ability to use standard processing for the metal lines on the insulation. More specifically, this means the ability to integrate laser restructurable elements using standard silicon based MOS processing without the need to incorporate additional steps. Fuse links, which produce conductive links using silicon diffusion, have been used for some time to achieve compatibility with CMOS processing, as disclosed in U.S. Pat. No. 4,937,475, issued to F. M. Rhodes et al. on Jun. 26, 1990.

Other recent exemplary techniques have been proposed using laser linking processes for interconnecting metal layers at different levels. One such technique is disclosed in U.S. Pat. No. 5,166,556 issued on Nov. 24, 1992 to F. Shu et al. in which a laser beam is applied to an upper titanium metal layer at the location at which a link is desired to be made with a lower titanium layer. Laser power is supplied at a sufficient level to cause a chemical reduction reaction between the titanium layers and the intermediate silicon dioxide insulating layer so as to produce a conductive compound between the titanium layers which acts as an electrically conductive circuit therebetween. Such technique requires additional non-standard process steps and produces high resistance links and, hence, low performance.

U.S. Pat. No. 4,810,663 issued to J. I. Raffell et al. on Mar. 7, 1989 discusses a technique in which a diffusion barrier layer is placed between each metal layer and the insulation layer and the link region is exposed to a low power laser for a relatively long time (i.e., a relatively long pulse width) to cause the metals to alloy with the diffusion and insulating layers to form the desired conductive link. Such technique requires a relatively long laser power pulse output using a relatively complicated diffusion barrier/insulation structure so as to produce an opening in the upper layer to permit the energy to be applied to the barrier and insulating layers to produce the desired alloying operation.

A further technique has been proposed to provide lateral links between metals substantially at the same surface or plane as discussed in U.S. Pat. No. 4,636,404 issued to J. I. Raffell et al. on Jan. 13, 1987. Again relatively long pulses are applied to the general region between the metals so as to cause the metals to form an aluminum doped silicon link.

In a recent article "Laserpersonalization of Interconnection Arrays for Hybrid ASIC's" of M. Burnus et al., IEEE International Conference on Wafer Scale Integration, 1993, a laser beam is used to provide sufficient power to blast a hole through an upper metal layer so as to form an opening at the link region. Multiple laser pulses of high energy density are used to create the opening and to remove the insulating layer between the metal elements. The multiple pulses also produce molten aluminum which spreads along the walls of a crater that is formed when the insulating layer is removed beneath the opening. Such aluminum flow along the crater walls produces a tube-like aluminum contact body between the upper and lower aluminum layers.

The article "Laser Programmable Vias for Reconfiguration of Integrated Circuits" by Rouillon-Martin et al. in Optical Microlithography and Metrology for Microcircuit Fabrication, 1989, discloses a technique which performs a similar operation to that discussed in the above Burnass et al. article in which the opening is made much smaller in diameter by using multiple pulses of a relatively highly focused laser beam.

It is desirable to devise a laser linking process which produces a link structure between any two metal layers which can be fabricated in a manner which is compatible with standard MOS processes and which provides high performance (low resistance) and high density (small area) links. Such process should use relatively low laser power and provide self-contained links with low peripheral damage at the link sites.

BRIEF SUMMARY OF THE INVENTION

In accordance with one embodiment of the invention, in a linking process an energy producing device, e.g., a laser, applies a single pulse of sufficient energy to at least one of two conductive materials which are to be linked, and which have a non-conductive material between them, so as to produce mechanical strain in at least one of the conductive materials. The strain that is produced initiates a fracturing of the non-conductive material so as to provide at least one fissure therein which extends between the conductive materials. The single energy pulse applied by the energy producing device further causes a portion of at least one of the conductive materials to flow in the at least one fissure to provide at least one conductive link between the conductive materials. In most cases, an effective fissure extends from a point at or near an edge of at least one of the conductive materials to the other conductive material.

In another embodiment of the invention, an upper metal layer is deposited on the non-conductive material in a manner so as to provide a pre-formed opening at the desired link site. A single pulse of energy can then be used to be effectively applied to the lower metal layer at the link site so as to produce the mechanical strain required to initiate the fracturing of the dielectric or insulating material, as discussed above. In a still further embodiment of the invention, if a pre-formed opening is used in the upper metal layer, a single laser pulse of energy may be used to provide a desired chemical reaction, or desired alloying, or a desired removal of the dielectric to create a crater therein, without having to produce an opening through the upper metal layer. Accordingly, by the use of such a pre-formed opening a conductive link may be formed from a chemical reduction reaction process, an alloying process, or from the flow of metal in a crater formed in the dielectric which has been removed at the link site. Thus, in some cases the use of the pre-formed opening may not require a fracturing of the dielectric material between the metal elements.

DESCRIPTION OF THE INVENTION

The invention can be described in more detail with the help of the accompanying drawings wherein FIG. 1 shows a plan view of an embodiment of the invention depicting an exemplary site at which a conductive link is to be produced;

Figure 1:
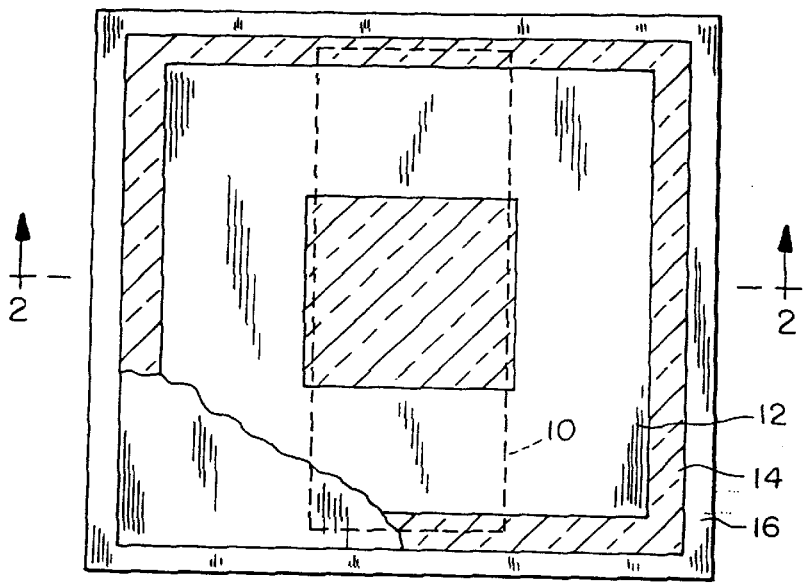
Figure 2:
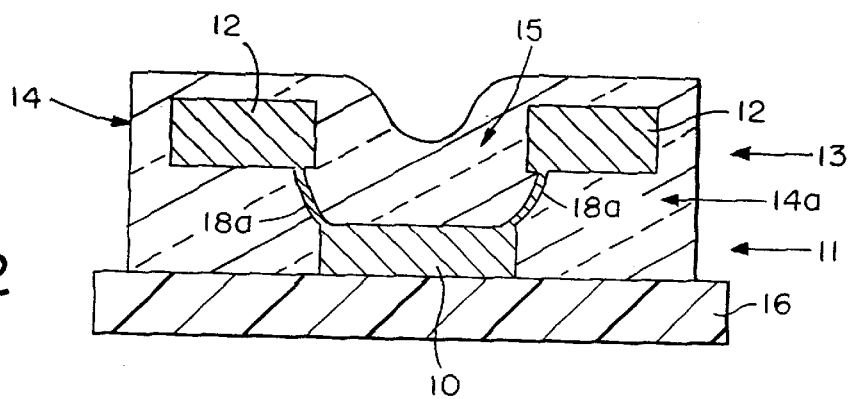
FIG. 2 shows a view in section along the lines 1–2 of the link site shown in FIG. 1.

As can be seen in FIGS. 1 and 2, a lower conductive material in the form of a metal element 10 lies generally in a first plane 11 at a lower level with reference to an upper conductive material in the form of a metal element 12 which lies in generally a second plane 13 above metal element 10. In the particular embodiment depicted, a non-conductive (insulating) material 14, such as a glass dielectric, effectively encloses metal elements 10 and 12 and provides a layer 14A thereof between such elements. In a preferred embodiment of the process of the invention a pre-formed opening 15 is provided in metal element 12 at the desired link site. The metal elements and the insulating material are mounted on a suitable substrate 16 such as a further glass or other appropriate substrate material. It is desired to provide an electrically conductive link between the metal elements 10 and 12.

Figure 3:
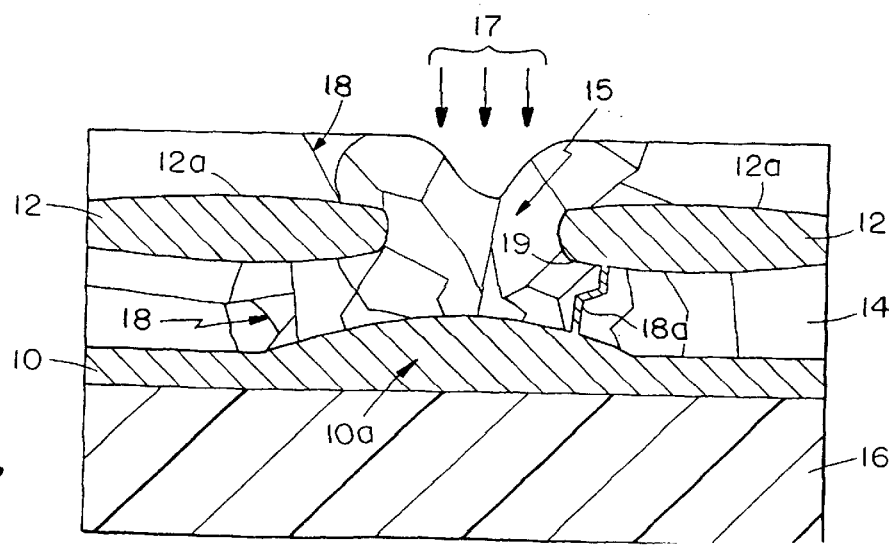
FIG. 3 shows a view in section of another embodiment of the invention depicting a site at which a conductive link has been produced in accordance with the invention.

A link site shown in FIG. 3 is similar to that depicted in FIGS. 1 and 2, except that the width of the lower metal layer 10 is co-extensive with the width of upper metal layer 12.

As shown in FIG. 3 an energy producing device, such as a laser (not specifically shown in the Figure), is positioned above the link site so as to apply laser energy, depicted by arrows 17, through the structure of FIG. 3 at the opening 15 thereof. Such laser energy is applied in the form of a single pulse of energy, as discussed in more detail below. The energy of the single pulse so applied is at a sufficient power level that it causes either or both metal elements 10 and 12 to become heated so that mechanical strains are produced therein and both elements thermally expand at portions thereof where the energy is applied, as shown by the exaggerated thermally expanded portions 10A and 12A thereof.

The mechanical strains thereby initiate a fracturing of the glass dielectric material 14 so as to produce one or more fissures 18 therein, particularly in the region 14A thereof. While the fissures which are so produced may extend throughout the material 14 one or more of them will extend from metal element 12 to metal element 10, normally one or more of the latter fissures extending from a position at or near at least one edge 19 of metal element 12, as shown by exemplary fissure 18A. The laser energy further causes metal from at least one of the metal layers, e.g., the layer with the lower melting point, to flow from such layer into the fissure so as to contact the other layer, as shown. Similar fissures and at least one conductive link between layers 10 and 12 would be produced in the structure of FIGS. 1 and 2 as shown by an exemplary conductive links 18A in FIG. 2.

In a particular embodiment of the invention, used for the link site shown in FIG. 3, for example, a continuous wave argon ion laser was applied to the link site, which had a site area of 4 $\mu$m×4 $\mu$m and an opening area of 2 $\mu$m×2 $\mu$m, via a suitable electro-optical shutter, shutter driver circuitry, and associated optical elements, such structures and operation being well known to those in the art. The metal layers were separated by a layer of a silicon oxide dielectric having a layer thickness of 0.75 $\mu$m. between the metal layers. The laser produced single pulses of laser output power of about 1.0 watts having a pulse width from about 1 microsecond ($\mu$s) to about 3 $\mu$s. The shutter was arranged to provide laser power rise and fall times, i.e., between about 10% to 90% of full power, of about 200 nanoseconds (ns). The laser output pulse was formed to provide a minimum beam diameter, through a microscope objective lens producing a 1/e radius of about 1.0 micrometers ($\mu$m).

Single pulses of such pulse widths were found to provide a high probability of producing one or more satisfactory conductive links, i.e., a failure rate of less than one in approximately fifty links, in the above embodiment. Further increases in the pulse width did not appear to provide any significant improvement in link probability and pulse widths between about 1 to 3 microseconds appeared to be adequate for the structure shown. In some cases it is believed that even smaller pulse widths can be used, e.g., greater then about 1 nanoseconds (ns) so long as they provide sufficient energy to cause the fracturing and metal flow required.

Moreover, in the above described particular embodiment process it was found that using more than a single pulse also did not appear to improve the probability of forming one or more conductive links and that, if a single pulse failed to produce at least one link, the use of additional pulses did not tend to do so.

In the particular embodiment discussed above it was also found that laser output power in a range from about 0.5 to 1.0 watts proved to be sufficient to provide one or more fissures to form the desired conducting links. For example, a peak laser output power of 0.72 watts yielded 98.2% out of 1021 link attempts using pulse widths of one microsecond ($\mu$s). The differences in linking probabilities, when the power used was varied from 0.6 to 0.72 watts, for example, using pulse widths of 2 $\mu$s and 3 $\mu$s, appeared to be relatively insignificant. It is believed that further improvement will occur by scaling the configuration of FIGS. 1 and 2, for example, to provide a link site area of 4 $\mu$m×4 $\mu$m, or smaller, such that a failure rate of less than 1 in 10000 links should be achievable.

Figure 4:
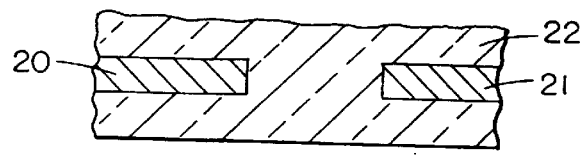
FIG. 4 shows a view in section of another embodiment of the invention depicting a site at which a lateral conductive link is to be produced between metal elements, generally in the same plane.
Figure 5:
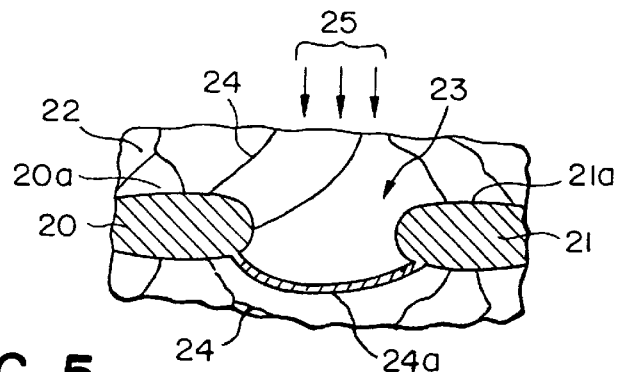
FIG. 5 shows a view in section of the site of FIG. 4 in which a conductive link is provided in accordance with the invention.

The above dielectric fracturing technique for providing vertical links between upper and lower metal layers can also be used to produce horizontal, or lateral, links between metal elements lying in substantially the same plane, as shown in FIGS. 4 and 5. As seen therein, a pair of separated metal elements 20 and 21 are enclosed in a dielectric (e.g., a silicon based glass or polymer) material 22. A laser energy pulse 25 is applied to the region 23 between the metals. The laser pulse produces mechanical strains in the metal elements so that they tend to expand so as to provide stresses concentrated at the corners thereof adjacent region 23, as shown by expanded regions 20A and 21A. Such expansions initiate a fracturing of the dielectric material 22 so as to produce one or more fissures therein, at least one of which will extend from one metal element 20 to the other metal element 21, as shown by exemplary fissures 24. Metal from at least one of the metals will tend to flow through the at least one fissure to form a conductive link between metals 20 and 21, as shown by exemplary fissure 24A.

Figure 6:
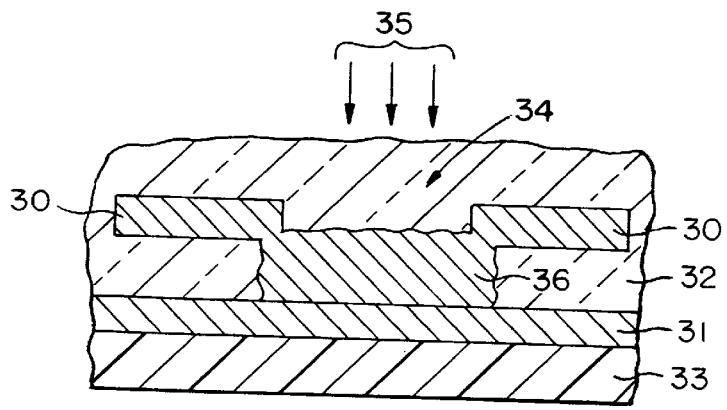
FIG. 6 shows a view in section of another embodiment of the invention depicting a site using an alloying or chemical reaction in the dielectric between the metal layers thereof.

In another embodiment of the invention, it has been found that the use of a pre-formed opening, such as pre-formed in an upper metal layer, will permit the formation of a conductive link between an upper metal layer and a lower metal layer without necessarily requiring a fracturing of the dielectric material therebetween. The use of such a pre-formed opening tends to focus the laser beam energy more efficiently at the link region. As shown in FIG. 6, an upper metal element 30 and a lower metal element 31 are enclosed by a dielectric material 32, the overall structure being positioned on a dielectric substrate 33. An opening 34 is pre-formed in metal element 30 prior to the application of any energy thereto. A single pulse of laser power 35 applied at the region of the opening 34 can be used to cause the metal near such region to flow into the dielectric region and to alloy with the dielectric material or to produce a chemical reduction reaction with the dielectric material, as discussed above, at the region 36. Such alloying or chemical reaction processes cause the dielectric material to become conductive and form a conductive link between metals 30 and 31. Because a pre-formed opening is used, a single pulse of relatively low laser power can be used in contrast with prior art systems where the laser energy must be sufficient to provide the alloying or chemical reaction processes required, which processes tend to result in producing an opening in the upper metal element 30.

Figure 7:
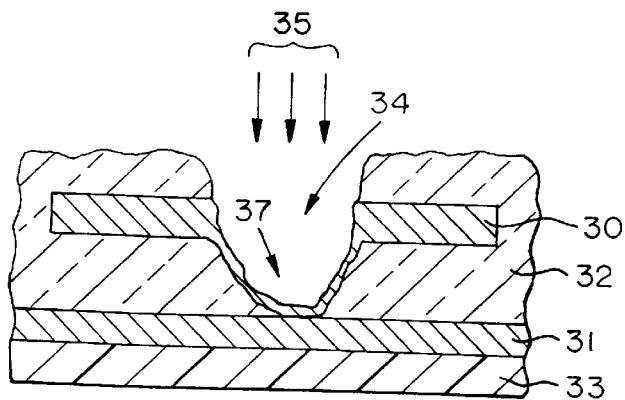
FIG. 7 shows a view in section of another embodiment of the invention depicting a site at which a conductive link is provided by forming a crater in the dielectric material between the metal layers thereof.

Alternatively, if an alloying or chemical reaction process is not used, the use of such pre-formed opening permits the laser energy to be focused more effectively at the dielectric material so as to remove such material in the region under the opening to expose the laser metal layer to form a crater 37. The laser energy also causes the metal from elements 30 and 31 to flow along the sides of the crater that is so formed, as shown in FIG. 7.

While the particular embodiments of the invention discussed above are preferred, modifications thereto may occur to those in the art within the spirit and scope of the invention. Hence, the invention is not to be construed as limited to the specific embodiments discussed, except as defined by the appended claims.

What is claimed is:

1. A method for providing a conductive link between a first conductive material and a second conductive material, said method comprising placing a non-conductive material between said first and second conductive materials;

applying sufficient energy to at least one of said first or second conductive materials to produce mechanical strain in at least one of said first or second materials, said strain initiating the fracturing of said non-conductive material so as to provide at least one fissure therein extending between said first and second conductive materials, said energy further causing a portion of at least one of said first or second conductive materials to flow in said at least one fissure to provide a conductive link between said first and second conductive materials.

2. A method in accordance with claim 1 wherein said at least one fissure extends from at or near an edge of at least one of said first or second conductive materials to the other of said first or second conductive materials.

3. A method in accordance with claim 1 wherein said first conductive material is a first metal lying in a first plane and second conductive material is a second metal lying in a second plane and said at least one fissure extends generally vertically between said first and second metals.

4. A method in accordance with claim 1 wherein said first conductive material and said second conductive material are metals lying side by side and said at least one fissure extends generally laterally between said first and second materials.

5. A method in accordance with claims 3 or 4 wherein said non-conductive material is a glass material.

6. A method in accordance with claim 5 wherein said glass material is a silicon based dielectric material.

7. A method in accordance with claim 6 wherein said glass material is a polymer material.

8. A method in accordance with claim 1, 3 or 4 wherein said energy applying step includes applying a single pulse of energy.

9. A method in accordance with claim 8 wherein said single pulse of energy has a pulse width greater than about 1 nanosecond.

10. A method in accordance with claim 3 and further including pre-forming an opening in said upper conductive material at a site at which said conductive link is to be produced; and applying said energy to said opening.

11. A method in accordance with claim 1 wherein the energy is applied by means of a laser.

12. A method in accordance with claim 1 wherein sufficient energy is applied to cause sufficient thermal expansion of said first or second conductive material to initiate fracture without ablation.

* * * * *